(12) United States Patent
Yoon et al.

(10) Patent No.: US 9,177,660 B2
(45) Date of Patent: Nov. 3, 2015

(54) METHOD OF OPERATING MEMORY DEVICE

(71) Applicant: Samsung Electronics Co., Ltd, Suwon-si, Gyeonggi-do (KR)

(72) Inventors: Hyun-Jun Yoon, Seongnam-si (KR); Jae-Yong Jeong, Yongin-si (KR); Myung-Hoon Choi, Suwon-si (KR); Bo-Geun Kim, Suwon-si (KR); Ki-Tae Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 14/069,588

(22) Filed: Nov. 1, 2013

(65) Prior Publication Data

US 2014/0129903 A1    May 8, 2014

(30) Foreign Application Priority Data

Nov. 2, 2012   (KR) .................. 10-2012-0123648

(51) Int. Cl.
  *G06F 11/10* (2006.01)
  *G11C 16/26* (2006.01)
  *G11C 16/04* (2006.01)
  *G11C 29/00* (2006.01)

(52) U.S. Cl.
  CPC ............ *G11C 16/26* (2013.01); *G06F 11/1048* (2013.01); *G06F 11/1072* (2013.01); *G11C 16/0483* (2013.01); *G11C 29/00* (2013.01)

(58) Field of Classification Search
  CPC ............... G11C 11/5642; G11C 16/26; G11C 16/0483; G11C 2029/0411; G11C 16/10; G11C 29/00; G06F 11/1048; G06F 11/1072
  USPC ......... 714/773, 763, 764; 365/185.03, 185.09
  See application file for complete search history.

(56) References Cited

U.S. PATENT DOCUMENTS

| | | | |
|---|---|---|---|
| 8,000,135 B1 | 8/2011 | Perlmutter et al. | |
| 8,243,511 B2 * | 8/2012 | Patapoutian et al. | 365/185.02 |
| 8,479,083 B2 * | 7/2013 | Chae et al. | 714/780 |
| 8,510,636 B2 * | 8/2013 | Ruby et al. | 714/773 |
| 8,510,637 B2 * | 8/2013 | Tseng et al. | 714/773 |
| 8,683,297 B2 * | 3/2014 | Jeon et al. | 714/769 |
| 2008/0109702 A1 * | 5/2008 | Brandman | 714/763 |
| 2009/0164871 A1 * | 6/2009 | Jo | 714/764 |
| 2009/0316481 A1 | 12/2009 | Nazarian | |
| 2010/0199138 A1 * | 8/2010 | Rho | 714/746 |
| 2011/0066899 A1 | 3/2011 | Kang et al. | |
| 2011/0099438 A1 | 4/2011 | Gonzalez et al. | |
| 2011/0179306 A1 * | 7/2011 | Huang | 714/6.11 |
| 2011/0182120 A1 | 7/2011 | Kang et al. | |

(Continued)

*Primary Examiner* — James C Kerveros
(74) *Attorney, Agent, or Firm* — Ellsworth IP Group PLLC (57) ABSTRACT

A method of operating a memory device includes changing a first read voltage, which determines a first voltage state or a second voltage state, to a voltage within a first range and determining the voltage as a first select read voltage, and changing a second read voltage, which is used to determine whether the data stored in the memory cells is a third different voltage state or a fourth different voltage state, to a voltage within a second different range and determining the voltage as a second select read voltage. The first voltage state overlaps the second voltage. The third voltage state overlaps the fourth voltage state. A difference between a voltage at an intersection of the third and fourth voltage states and the second read voltage is greater than a difference between a voltage at an intersection of the first and second voltage states and the first read voltage.

14 Claims, 7 Drawing Sheets

(56) References Cited

U.S. PATENT DOCUMENTS

| | | |
|---|---|---|
| 2011/0194348 A1 | 8/2011 | Mokhlesi et al. |
| 2012/0005558 A1* | 1/2012 | Steiner et al. ............. 714/773 |
| 2012/0144267 A1* | 6/2012 | Yeh et al. ................. 714/763 |
| 2013/0073924 A1* | 3/2013 | D'Abreu et al. ........... 714/763 |
| 2013/0139035 A1* | 5/2013 | Zhong et al. .............. 714/773 |
| 2013/0198589 A1* | 8/2013 | Choi et al. ................ 714/773 |
| 2013/0297988 A1* | 11/2013 | Wu et al. .................. 714/773 |
| 2014/0059406 A1* | 2/2014 | Hyun et al. ............... 714/773 |

\* cited by examiner

METHOD OF OPERATING MEMORY DEVICE

CROSS-REFERENCE TO RELATED APPLICATIONS

This application claims priority from Korean Patent Application No. 10-2012-0123648 filed on Nov. 2, 2012 in the Korean Intellectual Property Office, the disclosure of which is incorporated herein by reference in its entirety.

BACKGROUND

1. Field

The present general inventive concept relates to a method of operating a memory device.

2. Description of the Related Art

Memory devices are classified into volatile memory devices and nonvolatile memory devices. The volatile memory devices lose stored data when the power supply is turned off. Examples of the volatile memory devices include static random access memories (SRAMs), dynamic random access memories (DRAMs), and synchronous dynamic random access memories (SDRAMs). On the other hand, the nonvolatile memory devices retain stored data even when the power supply is interrupted.

Examples of the nonvolatile memory devices include flash memories, read-only memories (ROMs), programmable read-only memories (PROMs), erasable programmable read-only memories (EPROMs), electrically erasable programmable read-only memories (EEPROMs), and resistive memories (e.g., phase-change random access memories (PRAMs), ferroelectric random access memories (FRAMs), and resistive random access memories (RRAMs)).

A flash memory may perform an electric erase operation on a block-by-block basis and a program operation on a bit-by-bit basis.

Threshold voltages of a plurality of programmed memory cells included in a flash memory may change due to various causes. A change in the threshold voltages of the memory cells can undermine the reliability of read data.

SUMMARY

Exemplary embodiments of the present general inventive concept provide a method of operating a memory device, the method being employed to improve the reliability of read data and enhance read performance.

Additional features and utilities of the present general inventive concept will be set forth in part in the description which follows and, in part, will be obvious from the description, or may be learned by practice of the general inventive concept.

According to exemplary embodiments of the present general inventive concept, a method is used to operate a memory device. The method includes changing a first read voltage, which is used to determine whether data stored in memory cells is a first voltage state or a second voltage state, to a voltage within a first range and determining the voltage as a first select read voltage, and changing a second read voltage, which is used to determine whether the data stored in the memory cells is a third voltage state or a fourth voltage state, to a voltage within a second range which is different from the first range, and determining the voltage as a second select read voltage, wherein the first and second voltage states are different from the third and fourth voltage states, the first voltage state and the second voltage state overlap each other, the third voltage state and the fourth voltage state overlap each other, and a difference between a voltage at an intersection of the third and fourth voltage states and the second read voltage is greater than a difference between a voltage at an intersection of the first and second voltage states and the first read voltage.

According to another exemplary embodiment of the present general inventive concept, a memory system includes a nonvolatile memory device that has a plurality of memory cells into which data is programmed, and a controller controlling the nonvolatile memory device. The controller may include a microprocessor changing a first read voltage, which is used to determine whether the data stored in the memory cells is a first voltage state or a second voltage state, to a voltage within a first range and determining the voltage as a first select read voltage and changing a second read voltage, which is used to determine whether the data stored in the memory cells is a third voltage state or a fourth voltage state, to a voltage within a second range and determining the voltage as a second select read voltage. The controller may also include an Error Correcting Code (ECC) encoder creating data added with parity bits by performing ECC encoding on data which is to be provided to the nonvolatile memory device, and an ECC decoder correcting error bits of the data added with the parity bits. The nonvolatile memory device may include a voltage generator to generate the first and second read voltages, n candidate voltages that include the first select read voltage, and m candidate voltages that include the second select read voltage, where n and m are natural numbers, an X decoder to receive the first and second read voltages and the first and second select read voltages generated by the voltage generator and to drive the memory cells using the first and second read voltages and the first and second select read voltages, and a register to store the determined first and second select read voltages.

Exemplary embodiments of the present general inventive concept may provide a nonvolatile memory device having a plurality of memory cells (memory cell array) into which data is programmed, where the nonvolatile memory device includes control logic to control operation of the nonvolatile memory device in accordance with received commands and a voltage generator to generate first and second read voltages, n candidate voltages including a first select read voltage, and m candidate voltages including a second select read voltage, where n and m are natural numbers. The nonvolatile memory device may also include a decoder to receive the first and second read voltages and the first and second select read voltages generated by the voltage generator and to drive the memory cells (memory cell array) using the first and second read voltages and the first and second selected read voltages, as well as a register to store the determined first and second select read voltages.

The control logic may determine whether a number of failed cells is equal to or greater than a first limit value when the first read voltage is applied to the memory cells (memory cell array) and may determine whether the number of failed cells is equal to or greater than a second limit value when the second read voltage is applied to the memory cells (memory cell array).

Exemplary embodiments of the present general inventive concept may provide a nonvolatile memory device having a plurality of memory cells (memory cell array) into which data is programmed, where the nonvolatile memory device includes a voltage managing unit to control operation of the nonvolatile memory device in accordance with received commands, to generate first and second read voltages, n candidate voltages comprising a first select read voltage, and m candidate voltages comprising a second select read voltage, where n and m are natural numbers and to store the determined first and second select read voltages, and to store the determined first and second select read voltages. The nonvolatile memory device may also include a decoder to receive the first and second read voltages and the first and second select read voltages generated by the voltage managing unit and to drive the memory cells (memory cell array) using the first and second read voltages and the first and second selected read voltages.

The voltage managing unit may include control logic to control operation of the nonvolatile memory device in accordance with received commands, a voltage generator to generate first and second read voltages, n candidate voltages comprising a first select read voltage, and m candidate voltages comprising a second select read voltage, where n and m are natural numbers, and a register to store the determined first and second select read voltages, and a register to store the determined first and second select read voltages.

The control logic may determine whether a number of failed cells is equal to or greater than a first limit value when the first read voltage is applied to the memory cells (memory cell array) and may determine whether the number of failed cells is equal to or greater than a second limit value when the second read voltage is applied to the memory cells (memory cell array).

Exemplary embodiments of the present general inventive concept may provide a memory system that includes a nonvolatile memory device having a plurality of memory cells (memory cell array) into which data is programmed to provide a number of failed programmed memory cells that is less than or equal to a number of failed cells correctable by performing error correction code (ECC) encoding, and a controller to change a first read voltage, which is used to determine whether the data stored in the memory cells (memory cell array) is a first voltage state or a second voltage state, to a voltage within a first range and to determine the voltage as a first select read voltage and to change a second read voltage, which is used to determine whether the data stored in the memory cells (memory cell array) is a third voltage state or a fourth voltage state, to a voltage within a second range and to determine the voltage as a second select read voltage, to create data added with parity bits by performing ECC encoding on data which is to be provided to the nonvolatile memory device 120, and to correct error bits of the data added with the parity bits.

The controller may include a microprocessor to change a first read voltage, which is used to determine whether the data stored in the memory cells (memory cell array) is a first voltage state or a second voltage state, to a voltage within a first range and to determine the voltage as a first select read voltage and to change a second read voltage, which is used to determine whether the data stored in the memory cells (memory cell array) is a third voltage state or a fourth voltage state, to a voltage within a second range and to determine the voltage as a second select read voltage, an error correction code (ECC) encoder to create data added with parity bits by performing ECC encoding on data which is to be provided to the nonvolatile memory device, and an ECC decoder to correct error bits of the data added with the parity bits.

The nonvolatile memory device may include control logic to control operation of the nonvolatile memory device in accordance with received commands, a voltage generator to generate the first and second read voltages, n candidate voltages comprising the first select read voltage, and m candidate voltages comprising the second select read voltage, where n and m are natural numbers, a decoder to receive the first and second read voltages and the first and second select read voltages generated by the voltage generator and to drive the memory cells (memory cell array) using the first and second read voltages and the first and second select read voltages, and a register to store the determined first and second select read voltages.

The control logic may determine whether a number of failed cells is equal to or greater than a first limit value when the first read voltage is applied to the memory cells (memory cell array) and may determine whether the number of failed cells is equal to or greater than a second limit value when the second read voltage is applied to the memory cells (memory cell array).

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. In the attached figures, the thickness of layers and regions is exaggerated for clarity.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present general inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present general inventive concept will now be described more fully with reference to the accompanying drawings, in which exemplary embodiments of the present general inventive concept are illustrated.

For ease of description, a case where the present general inventive concept is applied to a 2-bit multi-level cell (MLC) will be described below. However, the present general inventive concept is not limited to this case, and the present general inventive concept may also be applied to a single-level cell (SLC) or a 3 or more-bit MLC.

A read voltage that varies according to the shift of threshold voltage distributions will now be described with reference to FIGS. 1A, 1B, and 2.

Figure 1A:
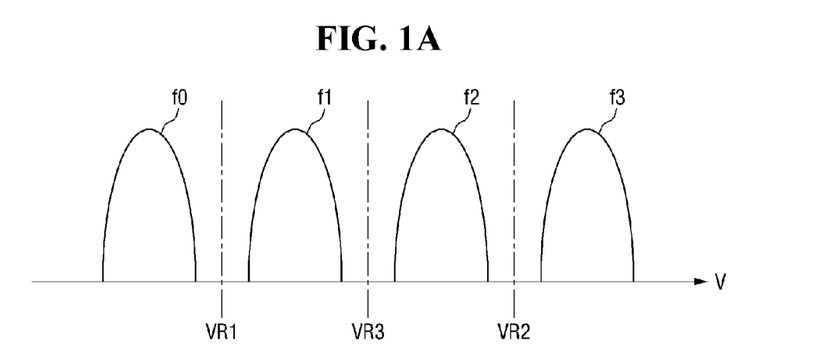
FIGS. 1A and 1B illustrate voltage states of a multi-level cell (MLC)
Figure 1B:
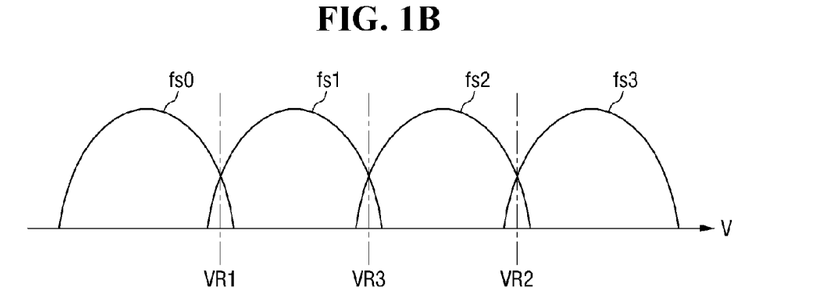
Figure 2:
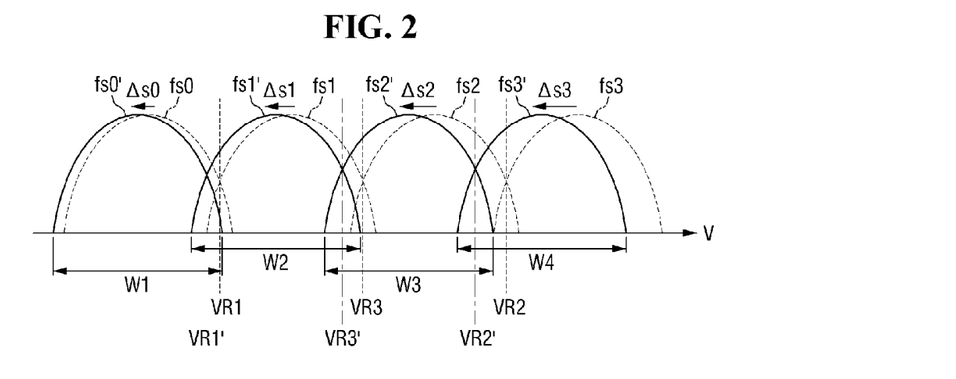
FIG. 2 is a diagram illustrating the shift of threshold voltage distributions.

FIGS. 1A and 1B illustrate voltage states of a MLC, and FIG. 2 illustrates the shift of threshold voltage distributions.

FIG. 1A illustrates an ideal case of voltage states f0 through f3 of a MLC. In FIGS. 1A and 1B, as well as FIGS. 2-7, a horizontal axis indicates a threshold voltage V of memory cells, and a vertical axis (not illustrated) would represent a number of memory cells (MC). Referring to FIG. 1A, a voltage of a 2-bit MLC into which data is programmed may be any one of four voltages states f0 through f3. For example, the first voltage state f0 may be an erase state E, and the second through fourth voltage states f1 through f3 may be first through third program states P1 through P3. However, the present general inventive concept is not limited thereto.

FIG. 1A illustrates a distribution of threshold voltages of memory cells when the memory cells are ideally programmed. That is, in an ideal case, the voltage states f0 through f3 may be spaced at regular intervals, with no overlap, as illustrated in FIG. 1A in order to provide a read margin between adjacent voltage states. In addition, each of the voltage states f0 through f3 may occupy a predetermined voltage range.

However, as the number of bits stored in a plurality of memory cells increases, the number of voltage states also increases. In addition, to provide a sufficient read margin and a sufficient number of voltage states, a sufficient voltage range should be secured so that voltage states may be distributed in the memory cells. However, since the amount of electric charges injected into a floating gate of a memory cell is limited, there is a limit to increasing a voltage.

FIG. 1B illustrates voltage states fs0 through fs3 of a multi-bit memory device. Read errors do not occur as long as the voltage states fs0 through fs3 do not overlap each other, as illustrated in FIG. 1A. However, this may not be the case in the actual memory device. Hence, the actual voltage states fs0 through fs3 may be formed as illustrated in FIG. 1B due to coupling, charge leakage, and the like in the actual memory device.

A read voltage (VR1, VR2, VR3) represents a voltage applied to a memory cell to discriminate a logic state of the memory cell during a read operation. For example, if a first read voltage VR2 is applied to determine the first voltage state fs0 and the second voltage state fs1, the first voltage state fs0 and the second voltage state fs1 may be determined correctly in the ideal case of FIG. 1A. However, since the first voltage state fs0 and the second voltage state fs1 partially overlap each other in the actual case of FIG. 1B, if a read operation is performed using the first read voltage VR1, failed cells may be produced as a result. Here, a failed cell is a memory cell which fails to be read even if a read voltage is applied to the memory cell in order to read data programmed into the memory cell to a certain voltage state.

The failed cells may be corrected using error correction code (ECC).

The number of failed cells that may be corrected using the ECC is limited. Therefore, a read voltage needs to be set efficiently before the ECC is performed. The read voltage may be set to a voltage which produces a smallest number of failed cells, and the number of failed cells may be smallest at a place where each voltage state meets another. For example, referring to FIG. 1B, when the first voltage state fs0 and the second voltage state fs1 are read, the number of failed cells is smallest at an intersection of the first voltage state fs0 and the second voltage state fs1, that is, at the first read voltage VR1, in an area where the first voltage fs0 and the second voltage state fs1 overlap each other. When the third voltage state fs2 and the fourth voltage state fs3 are read, the number of failed cells is smallest at an intersection of the third voltage state fs2 and the fourth voltage state fs3, that is, at a second read voltage VR2, in an area where the third voltage fs2 and the fourth voltage state fs3 overlap each other. Lastly, when the second voltage state fs1 and the third voltage state fs2 are read, the number of failed cells is smallest at an intersection of the second voltage state fs1 and the third voltage state fs2, that is, at a third read voltage VR3, in an area where the second voltage fs1 and the third voltage state fs2 overlap each other.

The voltage states fs0 through fs3 are not fixed. That is, the voltage states fs0 through fs3 may vary. Referring to FIG. 2, the first voltage state fs0 may be shifted by a first intervsal $\Delta s0$ to become a first voltage state fs0', the second voltage state fs1 may be shifted by a second interval $\Delta s1$ to become a second voltage state fs1', the third voltage state fs2 may be shifted by a third interval $\Delta s2$ to become a third voltage state fs2', and the fourth voltage state fs3 may be shifted by a fourth interval $\Delta s3$ to become a fourth voltage state fs3'. The first through fourth intervals $\Delta s0$ through $\Delta s3$ may be equal or different. For example, referring to FIG. 2, the intervals may be arranged smallest to greatest in the order of, but not limited to, $\Delta s0 < \Delta s1 < \Delta s2 < \Delta s3$.

The voltage states fs0 through fs3 may change to the voltage states fs0' through fs3' as described above for various reasons including deterioration due to repeated erases and writes, characteristics of memory cells themselves, charge leakage which occurs when an extended period occurs after data is programmed into the memory cells, coupling from an adjacent memory cell, external temperature, and characteristics of each layer in VNAND.

Although not illustrated in the drawing, respective widths W1 through W4 of the voltage states fs0 through fs3 may increase for the above reasons.

The voltage states fs0' through fs3' may intersect each other at different locations from the locations at which the voltage states fs0 through fs3 intersect each other. Accordingly, the read voltage which produces the smallest number of failed cells may be changed. Specifically, referring to FIG. 2, when an area between the first voltage state fs0' and the second voltage state fs1' is read, the read voltage which produces the smallest number of failed cells is not the first read voltage VR2 but a first select read voltage VR2'. Likewise, when an area between the third voltage state fs2' and the fourth voltage state fs3' is read, the read voltage which produces the smallest number of failed cells is not the second read voltage VR2 but a second select read voltage VR2'. When an area between the second voltage state fs1' and the third voltage state fs2' is read, the read voltage which produces the smallest number of failed cells is not the third read voltage VR3 but a third select read voltage VR3'. Therefore, the read voltage is reset according to the shift or change of the voltage states.

A method of operating a memory device according to a first embodiment of the present general inventive concept will now be described with reference to FIGS. 3 through 5.

Figure 3:
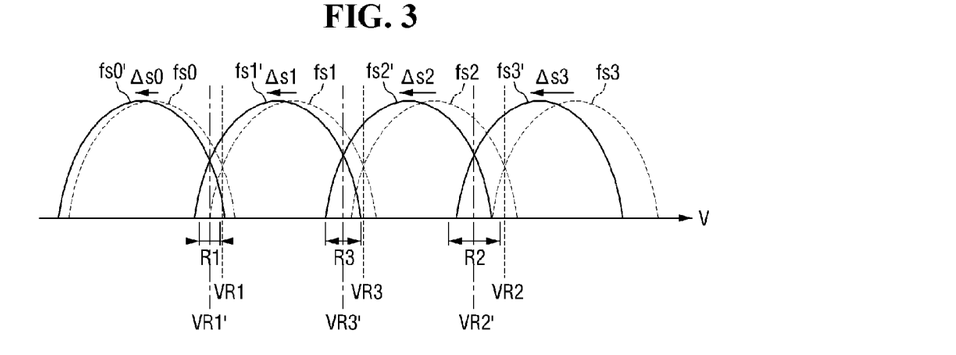
FIGS. 3 through 5 illustrate distributions of threshold voltages in a method of operating a memory device according to a first embodiment of the present general inventive concept.
Figure 4:
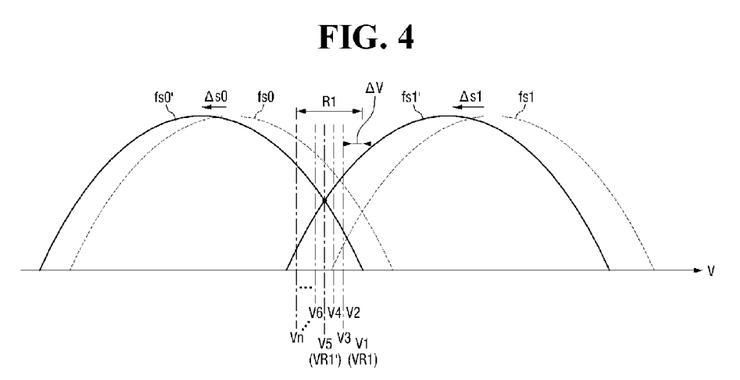
Figure 5:
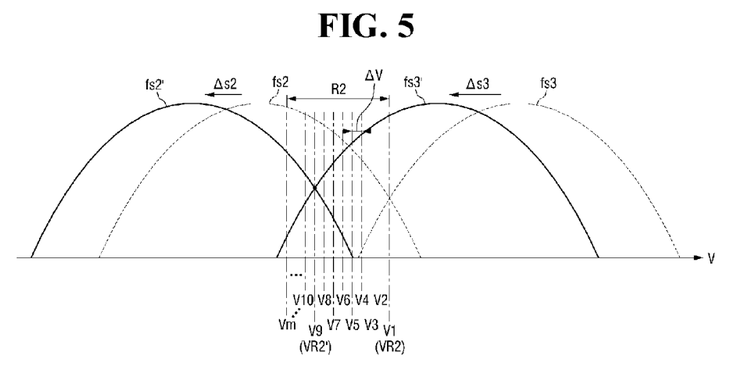

FIGS. 3 through 5 illustrate distributions of voltages in a method of operating a memory device according to a first embodiment of the present general inventive concept.

A plurality of memory cells into which data is programmed are provided. The memory cells may be programmed to first through fourth voltage states fs0' through fs3'. Here, the first and second voltage states fs0' and fs1' may be different from the third and fourth voltage states fs2' and fs3'. In addition, since the first through fourth voltage states fs0' through fs3' are actual voltage states, the first voltage state fs0' and the second voltage state fs1' may overlap each other, the second voltage state fs1' and the third voltage state fs2' may overlap each other, and the third voltage state fs2' and the fourth voltage state fs3' may overlap each other.

It is determined whether the data stored in the memory cells is the first voltage state fs0' or the second voltage state fs1' by applying a first read voltage VR1. In the same way, it is determined whether the data stored in the memory cells is the third voltage state fs2' or the fourth voltage state fs3' by applying a second read voltage VR2.

It is determined whether the number of failed cells is equal to or greater than a first limit value when the first read voltage VR2 is applied. Here, the first limit value is the number of failed cells that can be error-corrected using ECC. Since the number of failed cells that can be corrected using the ECC is limited, if the number of failed cells exceeds the number of cells that can be error-corrected using the ECC when the data programmed into the memory cells is read using the first read voltage VR1, a read failure occurs. Therefore, the first limit value cannot exceed the number of failed cells that can be corrected using the ECC.

If the number of failed cells is equal to or greater than the first limit value when the first read voltage VR2 is applied, the first read voltage VR2 is changed. If the number of failed cells is less than the first limit value when the first read voltage VR2 is applied, it is not necessary to change the first read voltage VR1.

When the second read voltage VR2 is applied, it is also determined whether the number of failed cells exceeds a second limit value. Here, the second limit value is the number of bits that can be error-corrected using the ECC. When the number of failed cells is equal to or greater than the second limit value, the second read voltage VR2 is changed. When the number of failed cells is less than the second limit value, the second read voltage VR2 is not changed.

The first and second limit values may be equal. However, the first and second limit values can be set to different values in view of characteristics of each of the voltage states fs0' through fs3'.

The first and second read voltages VR2 and VR2 can be changed as follows.

Referring to FIGS. 3 and 4, a first select read voltage VR2' may be determined as follows. First, a first range R1 is determined. The first range R1 is an arbitrary range determined to find the first select read voltage VR2' which produces the smallest number of failed cells. The first select read voltage VR2' is selected within the first range R1.

To find the first select read voltage VR2', n candidate voltages V1 through Vn in the first range R1 are applied. Here, n is a natural number, and the n candidate voltages V1 through Vn may be applied sequentially at intervals of a predetermined voltage ΔV. The numbers of failed cells produced when the candidate voltages V1 through Vn are applied are compared to select a candidate voltage which produces the smallest number of failed cells as the first select read voltage VR1'.

For example, referring to FIG. 4, of the candidate voltages V1 through Vn, a candidate voltage which produces the smallest number of failed cells is a candidate voltage V5 at an intersection of the first voltage state fs0' and the second voltage state fs1'. Therefore, the candidate voltage V5 is selected as the first select read voltage VR2'. In FIG. 4, the first select read voltage VR2' matches the intersection of the first voltage state fs0' and the second voltage state fs1'. However, this is not always the case. If no candidate voltage matches the intersection of the first voltage state fs0' and the second voltage state fs1', a candidate voltage closest to the intersection, that is, a candidate voltage which produces the smallest number of failed cells may be selected as the first select read voltage VR1'.

A second select read voltage VR2' may be determined as follows. Referring to FIGS. 3 through 5, a second range R2 is determined. The second range R2 is an arbitrary range determined to find the second select read voltage VR2' which produces the smallest number of failed cells. The second select read voltage VR2' is selected within the second range R2.

To find the second select read voltage VR2', m candidate voltages V1 through Vm in the second range R2 are applied. Here, m is a natural number, and the m candidate voltages V1 through Vm may be applied sequentially at intervals of a predetermined voltage ΔV. The numbers of failed cells produced when the candidate voltages V1 through Vm are applied are counted to select a candidate voltage which produces the smallest number of failed cells as the second select read voltage VR2'.

For example, referring to FIG. 5, of the candidate voltages V1 through Vm, a candidate voltage which produces the smallest number of failed cells is a candidate voltage V9 at an intersection of the third voltage state fs2' and the fourth voltage state fs3'. Therefore, the candidate voltage V9 is selected as the second select read voltage VR2'. In FIG. 5, the second select read voltage VR2' matches the intersection of the third voltage state fs2' and the fourth voltage state fs3'. However, this is not always the case. If no candidate voltage matches the intersection of the third voltage state fs2' and the fourth voltage state fs3', a candidate voltage closest to the intersection, that is, a candidate voltage which produces the smallest number of failed cells may be selected as the second select read voltage VR2'.

Referring to FIG. 3, the second range R2 may be different from the first range R1 because each voltage state may be shifted by a different amount. For example, referring to FIG. 3, a first voltage state fs0 was shifted by a first interval Δs0, a second voltage state fs1 was shifted by a second interval Δs1, a third voltage state fs2 was shifted by a third interval Δs2, and a fourth voltage state fs3 was shifted by a fourth interval Δs3. Since the interval increases in the order of Δs0<Δs1<Δs2<Δs3, the first and second voltage states fs0 and fs1 were shifted by smaller amounts than the third and fourth voltage states fs2 and fs3. Therefore, a difference between a voltage at the intersection of the third and fourth voltage states fs2' and fs3' and the second read voltage VR2 is greater than a difference between a voltage at the intersection of the first and second voltage states fs0' and fs1' and the first read voltage VR2. Due to the difference in the amounts by which the first through fourth voltage states fs0 through fs3 are shifted, the second range R2 to find the second select read voltage VR2' may be greater than the first range R1.

Since the second range R2 is greater than the first range R1, the number of the candidate voltages V1 through Vm in the second range R2 may be greater than the number of the candidate voltages V1 through Vn in the first range R1. Thus, m may be greater than n. Unlike the illustrations in FIG. 3, if the first range R1 is greater than the second range R2, m may be smaller than n.

If a range to find a select read voltage is set according to the amount by which each voltage state is shifted, the select read voltage may be found rapidly. Referring to FIG. 3, when the amounts (Δs0 and Δs1) by which the first and second voltage states fs0 and fs1 are shifted are minimal, the first select read voltage VR2' is similar in size to the first read voltage VR1. Therefore, the first range R1 to find the first select read voltage VR2' may be set to a minimal value. A smaller range results in a minimized number of candidate voltages. Therefore, a time to determine a select read voltage may be minimized. On the other hand, referring to FIG. 3, when the amounts (Δs2 and Δs3) by which the third and fourth voltage states fs2 and fs3 are shifted are greater than a predetermined amount, the second range R2 may be greater than the first range R1 because the second select read voltage VR2' should exist within the second range R2 and should be found accurately. If a range (R1, R2) to find a select read voltage is set according to an amount by which each voltage state is shifted, the select read voltage may be found rapidly and accurately.

A third read voltage VR3 between the second voltage state fs1 and the third voltage state fs2 may be changed in the same way as described above.

A method of operating a memory device according to a second embodiment of the present general inventive concept will now be described with reference to FIGS. 6 and 7. For simplicity, a description of elements and features identical to those described above will be omitted, and the following description will focus on differences.

Figure 6:
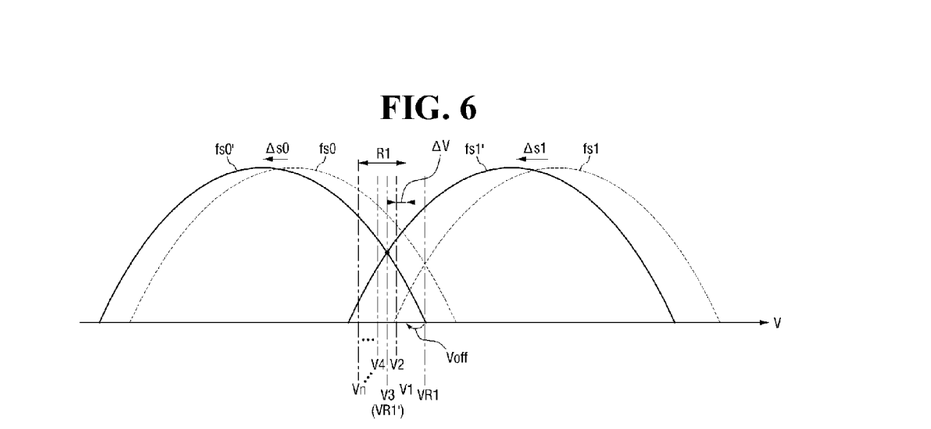
FIGS. 6 and 7 illustrate distributions of threshold voltages in a method of operating a memory device according to a second embodiment of the present general inventive concept.
Figure 7:
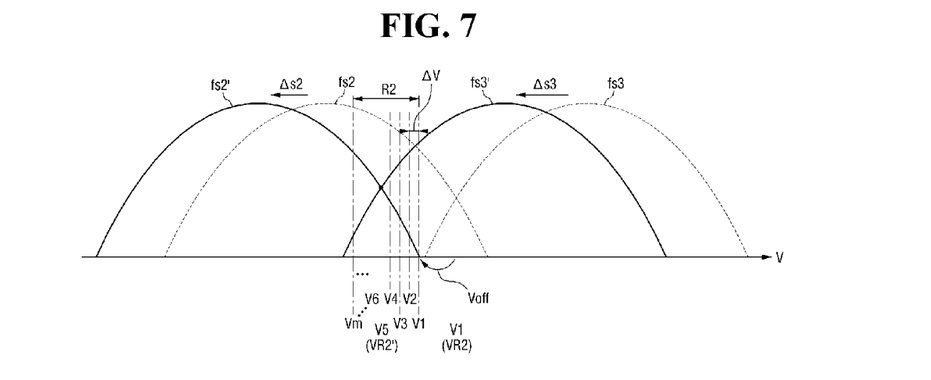

FIGS. 6 and 7 illustrate distributions of voltages in a method of operating a memory device according to a second embodiment of the present general inventive concept.

Referring to FIG. 6, unlike in FIG. 4, a first read voltage VR2 is not included in a first range R1. In FIG. 4, one (e.g., the candidate voltage V1) of the candidate voltages V1 through Vn is determined as the first read voltage VR2, and the first select read voltage VR2' is searched to use the candidate voltage V1. However, in FIG. 6, the first read voltage VR2 is not included in the first range R1. Of candidate voltages V1 through Vn, a candidate voltage V1 closest to the first read voltage VR2 is separated from the first read voltage VR2 by a first offset voltage Voff.

Referring to FIG. 7, unlike in FIG. 5, a second read voltage VR2 is not included in a second range R2. Specifically, in FIG. 5, one (e.g., the candidate voltage V1) of the candidate voltages V1 through Vm is determined as the second read voltage VR2, and the second select read voltage VR2' is searched to use the candidate voltage V1. However, in FIG. 7, the second read voltage VR2 is not included in the second range R2. Of candidate voltages V1 through Vm, a candidate voltage V1 closest to the second read voltage VR2 is separated from the second read voltage VR2 by a second offset voltage Voff.

If the first and second read voltages VR2 and VR2 are not included in the first and second ranges R1 and R2 as described above, the first and second ranges R1 and R2 may be reduced compared with the first and second ranges R1 and R2 in the method of operating a memory device according to the first embodiment of the present general inventive concept. Ultimately, the reduced first and second ranges R1 and R2 may make it possible to rapidly determine the first and second select read voltages VR2' and VR2'.

A first memory system according to exemplary embodiments of the present general inventive concept will now be described with reference to FIG. 8.

Figure 8:
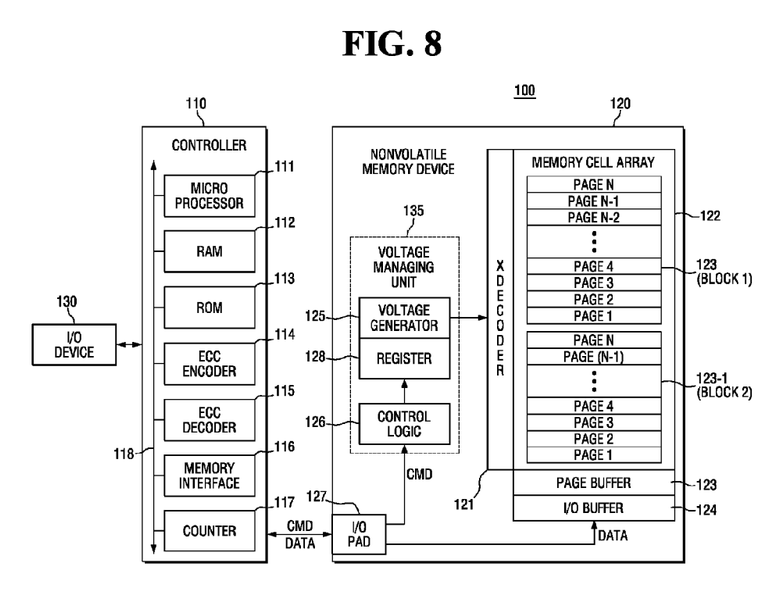
FIG. 8 is a block diagram of a first memory system according to exemplary embodiments of the present general inventive concept.

FIG. 8 is a block diagram of a first memory system 100 according to some embodiments of the present general inventive concept.

Referring to FIG. 8, the first memory system 100 includes a controller 110, a nonvolatile memory device 120, and an input/output (I/O) device 130. The nonvolatile memory device 120 may be, but is not limited to, a NAND flash memory device or a NOR flash memory device. The nonvolatile memory device 120 may include a planar memory cell structure and a 3D stacked memory cell structure.

The nonvolatile memory device 120 may include a memory cell array 122, an X decoder (a row selection circuit) 121, a voltage generator 125, an I/O pad 127, an I/O buffer 124, a page buffer 123, and a control logic 126.

The memory cell array 122 includes a plurality of memory cells into which data is programmed, a plurality of word lines W/L, and a plurality of bit lines B/L. Each of the memory cells may store 1-bit data or M-bit (multi-bit) data, where M is a natural number equal to or greater than two.

The memory cell array 122 may include a plurality of blocks and a plurality of pages. One block includes a plurality of pages. A page may be a unit of program and read operations, and a block may be a unit of erase operation. In a read operation, data programmed into one page is read.

The memory cell array 122 can be implemented as a single-layer array structure (also called a 2D array structure) or a multi-layer array structure (also called a 3D array structure).

The control logic 126 controls the overall operation of the nonvolatile memory device 120. When receiving a command CMD from the controller 110, the control logic 126 interprets the command CMD and controls the nonvolatile memory device 120 to perform an operation (such as a program operation, a read operation, a read retry operation, or an erase operation) corresponding to the interpreted command CMD. In addition, the control logic 126 determines whether the number of failed cells is equal to or greater than a first limit value when a first read voltage is applied to the memory cells and determines whether the number of failed cells is equal to or greater than a second limit value when a second read voltage is applied to the memory cells. Therefore, the control logic 126 may store determination results concerning the number of failed cells.

Under the control of the control logic 126, the voltage generator 125 generates one or more voltages required for a program operation, an operation of identifying target memory cells or an erase operation and provides at least one voltage selected by the X decoder 121. In addition, the voltage generator 125 may generate the first and second read voltages, n candidate voltages including a first select read voltage, and m candidate voltages including a second select read voltage.

The X decoder 121 is controlled by the control logic 126 and drives at least one of the word lines W/L implemented in the memory cell array 122 according to a row address. That is, the X-decoder 121 applies at least one voltage received from the voltage generator 125 to the memory cell array 122. For example, the X-decoder 121 receives the first and second read voltages and the first and second select read voltages from the voltage generator 125 and drives the memory cell array 122 using the received voltages.

A register 128 is a space which stores information input from the controller 110. The register 128 may include a plurality of latches. For example, the register 128 may store the first and second read voltages and the first and second select read voltages.

The page buffer 123 is controlled by the control logic 126 and operates as a sense amplifier or a write driver according to an operation mode (e.g., a read operation or a program operation).

The I/O pad 127 and the I/O buffer 124 may serve as a data I/O path between an external device (e.g., the controller 110) and the nonvolatile memory device 120.

The controller 110 may include a microprocessor 111, a read-only memory (ROM) 113, a random access memory (RAM) 112, an ECC decoder 115, an ECC encoder 114, a memory interface 116, a counter 117, and a bus 118. The above elements 111 through 117 of the controller 110 may be electrically connected to each other through the bus 118.

The microprocessor 111 controls the overall operation of the first memory system 100 including the controller 110. When power is supplied to the first memory system 100, the microprocessor 111 drives firmware (stored in the ROM 113) to operate the memory system 100 on the RAM 112, thereby controlling the overall operation of the first memory system 100. In addition, the microprocessor 111 may change the first read voltage, which is used to determine whether the data stored in the memory cells is a first voltage state or a second voltage state, to the first select read voltage within a first range and may change the second read voltage, which is used to determine whether the data stored in the memory cells is a third voltage state or a fourth voltage state, to the second select read voltage within a second range which is different from the first range.

In FIG. 8, driver firmware code of the first memory system 100 is stored in the ROM 113. However, the scope of the present general inventive concept is not limited thereto. The firmware code may also be stored in various nonvolatile memory devices 120 other than the ROM 113. Therefore, the control or intervention of the microprocessor 111 may encompass not only the direct control of the microprocessor 111, but also the intervention of firmware which is software driven by the microprocessor 111.

The first range and the second range may be stored in the ROM 113. However the present general inventive concept is not limited thereto. For example, two or more ranges may be stored in the ROM 113. The microprocessor 111 may determine the first and second select read voltages using the first and second ranges stored in the ROM 113.

The RAM 112, which is a memory serving as a buffer, may store an initial command, data, and various variables input from a host or data output from the nonvolatile memory device 120. The RAM 112 may store data and various parameters and variables input to and output from the nonvolatile memory device 120. For example, the RAM 112 may store the number of failed cells produced when each of the n candidate voltages is applied and the number of failed cells produced when each of the m candidate voltages is applied, so that the microprocessor 111 may determine the first and second select read voltages.

The memory interface 116 may serve as an interface between the controller 110 and the nonvolatile memory device 120. The memory interface 116 is connected to the I/O pad 127 of the nonvolatile memory device 120 and may exchange data with the I/O pad 127. In addition, the memory interface 116 may create a command appropriate for the nonvolatile memory device 120 and provide the created command appropriate for the nonvolatile memory device 120 to the I/O pad 127. The memory interface 116 provides a command to be executed by the nonvolatile memory device 120 and an address ADD of the nonvolatile memory device 120.

The ECC decoder 115 and the ECC encoder 114 perform error bit correction. The ECC encoder 114 generates data added with parity bits by performing error correction encoding on data which is to be provided to the nonvolatile memory device 120. The parity bits may be stored in the nonvolatile memory device 120.

The ECC decoder 115 performs error correction decoding on output data, determines whether the error correction decoding is successful based on the result of the error correction decoding, and outputs an instruction signal based on the determination result. Read data may be transmitted to the ECC decoder 115, and the ECC decoder 115 may correct error bits of the data using parity bits. For example, the ECC decoder 115 may correct error bits of data programmed into failed cells by correcting the failed cells produced when the first and second read voltages or the first and second select read voltages are applied. When the number of error bits exceeds a maximum number of error bits that can be corrected, the ECC decoder 115 cannot correct the error bits, resulting in an error correction failure. The ECC encoder 114 and the ECC decoder 115 may perform error correction using, but not limited to, low density parity check (LDPC) code, BCH code, turbo code, Reed-Solomon code, convolution code, recursive systematic code (RSC), or coded modulation such as trellis-coded modulation (TCM) or block coded modulation (BCM).

Each of the ECC encoder 114 and the ECC decoder 115 may include an error correction circuit, system or device.

The memory interface 116 provides a read command and an address to the nonvolatile memory device 120. The nonvolatile memory device 120 reads data stored in pages of a first block 123 corresponding to the received address. The read data is provided to the ECC decoder 115 via the I/O pad 127. The ECC decoder 115 checks error bits of the data provided by the nonvolatile memory device 120 and corrects the error bits.

The I/O device 130 may be connected between the host (not illustrated) and the controller 110 and may input/output data to/from the first memory system 100. For example, the I/O device 130 may deliver data to be programmed into the first memory system 100, receive data read by applying the first and second select read voltages from the first memory system 100, and output the received data.

A second memory system according to some embodiments of the present general inventive concept and application examples thereof will now be described with reference to FIGS. 9 and 10. For simplicity, a repetitive description of elements identical to those of the first memory system 100 according to some embodiments of the present general inventive concept will be omitted, and the following description will focus on differences from the first memory system 100.

Figure 9:
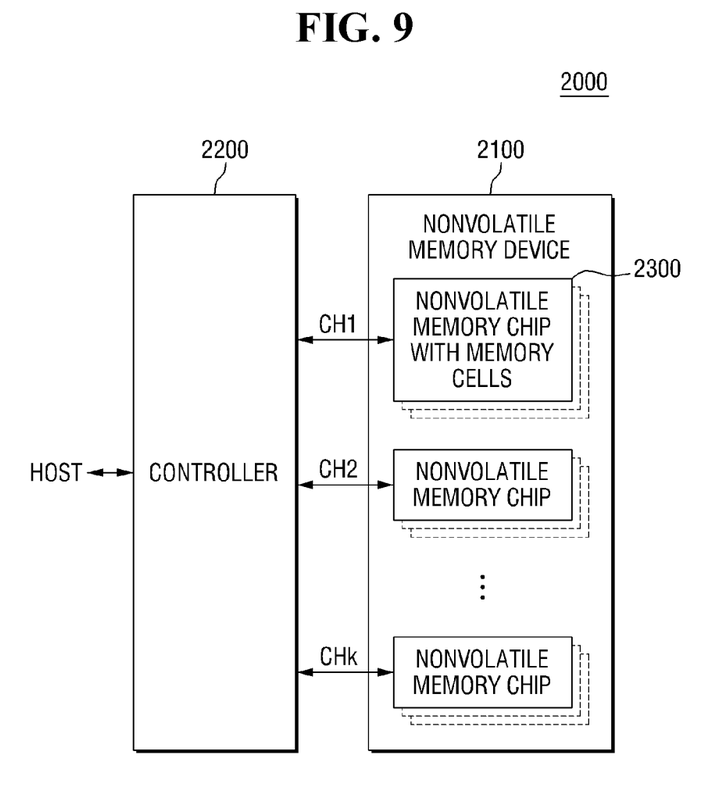
FIG. 9 is a block diagram of a second memory system according to exemplary embodiments of the present general inventive concept.

FIG. 9 is a block diagram of a second memory system 2000 according to exemplary embodiments of the present general inventive concept. FIG. 10 is a block diagram of a computing system 3000 including the second memory system 2000 of FIG. 9.

Referring to FIG. 9, the second memory system 2000 includes a nonvolatile memory device 2100 and a controller 2200. The nonvolatile memory device 2100 includes a plurality of nonvolatile memory chips, each including a memory cell array 122 (see FIG. 8). The nonvolatile memory chips form multiple memory chip groups. Each of the memory chip groups has one common channel to communicate with the controller 2200. For example, the nonvolatile memory chips may communicate with the controller 2200 through first through $k^{th}$ channels CH1 through CHk.

In FIG. 9, at least one nonvolatile memory chip is connected to one channel. That is, the second memory system 2000 may be arranged such that one nonvolatile memory chip is connected to one channel or a plurality of nonvolatile memory chips are connected to one channel.

The controller 2200 and the nonvolatile memory device 2100 may be integrated into one semiconductor device. Specifically, the controller 2200 and the nonvolatile memory device 2100 may be integrated into one semiconductor device to form a memory card. For example, the controller 2200 and the nonvolatile memory device 2100 may be integrated into one semiconductor device to form a personal computer (PC) card (e.g., Personal Computer Memory Card International Association (PCMCIA)), a compact flash card (CF), a smart media card (SM, SMC), a memory stick, a multimedia card (e.g., MMC, RS-MMC, MMCmicro), a SD card (e.g., SD, miniSD, microSD, SDHC), or a universal flash storage (UFS).

Alternatively, the controller 2200 and the nonvolatile memory device 2100 may be integrated into one semiconductor device to form a solid state drive (SSD). The SSD includes a storage device which stores data in a semiconductor memory. When the second memory system 2000 is used as an SSD, the operation speed of a host connected to the second memory system 2000 may increase significantly.

The second memory system 2000 may be implemented in a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

The nonvolatile memory device 2100 or the second memory system 2000 may be mounted using various forms of packages. The nonvolatile memory device 2100 or the memory system 1000 having a plurality of nonvolatile memory chips with memory cells 2300 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Figure 10:
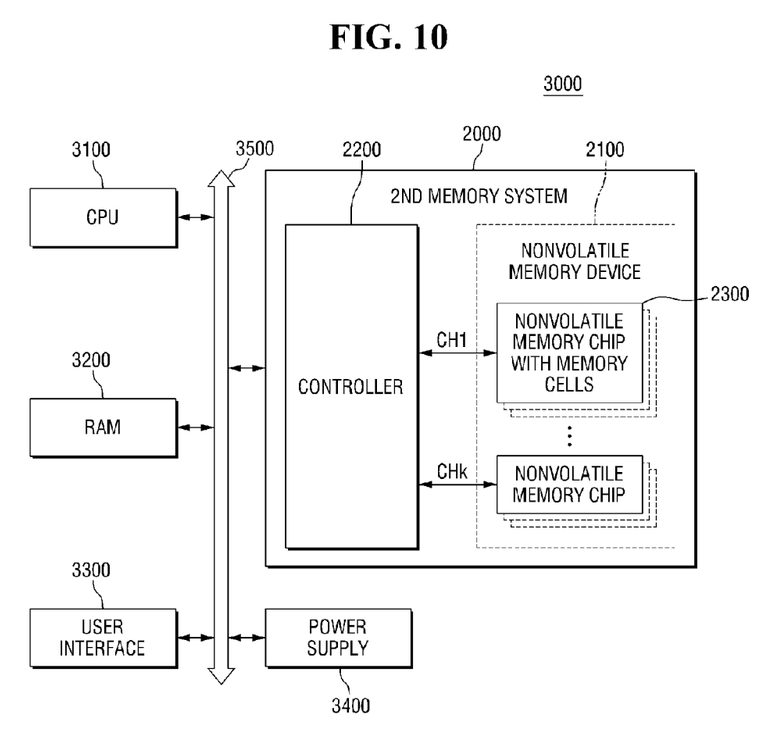
FIG. 10 is a block diagram of a computing system including the second memory system of FIG. 9.

Referring to FIG. 10, the computing system 3000 includes a central processing unit (CPU) 3100, a RAM 3200, a user interface 3300, a power supply 3400, and the second memory system 2000.

The second memory system 2000 is electrically connected to the CPU 3100, the RAM 3200, the user interface 3300, and the power supply 3400 through a system bus 3500. Data provided through the user interface 3300 or processed by the CPU 3100 is stored in the second memory system 2000.

In FIG. 10, the nonvolatile memory device 2100 is connected to the system bus 3500 through the controller 2200. However, the nonvolatile memory device 2100 can also be connected directly to the system bus 3500.

In FIG. 10, the second memory system 2000 described above with reference to FIG. 9 is provided. However, the memory system 2000 can be replaced by the first memory system 100 described above with reference to FIG. 8.

Alternatively, the computing system 3000 may include all of the memory systems 100 and 2000 described above with reference to FIGS. 8 and 9.

Referring to FIG. 8, exemplary embodiments of the present general inventive concept may provide a nonvolatile memory device 120 having a plurality of memory cells (memory cell array 122) into which data is programmed, where the nonvolatile memory device 120 includes control logic 126 to control operation of the nonvolatile memory device 120 in accordance with received commands and a voltage generator 125 to generate first and second read voltages, n candidate voltages including a first select read voltage, and m candidate voltages including a second select read voltage, where n and m are natural numbers. The nonvolatile memory device 120 may also include a decoder 121 to receive the first and second read voltages and the first and second select read voltages generated by the voltage generator 125 and to drive the memory cells (memory cell array 122) using the first and second read voltages and the first and second selected read voltages, as well as a register 128 to store the determined first and second select read voltages.

The control logic 126 may determine whether a number of failed cells is equal to or greater than a first limit value when the first read voltage is applied to the memory cells (memory cell array 122) and may determine whether the number of failed cells is equal to or greater than a second limit value when the second read voltage is applied to the memory cells (memory cell array 122).

Again referring to FIG. 8, exemplary embodiments of the present general inventive concept may provide a nonvolatile memory device 120 having a plurality of memory cells into which data is programmed, where the nonvolatile memory device 120 includes a voltage managing unit 135 to control operation of the nonvolatile memory device in accordance with received commands, to generate first and second read voltages, n candidate voltages comprising a first select read voltage, and m candidate voltages comprising a second select read voltage, where n and m are natural numbers and to store the determined first and second select read voltages.

The nonvolatile memory device 120 may include a decoder 121 to receive the first and second read voltages and the first and second select read voltages generated by the voltage managing unit 135 and to drive the memory cells using the first and second read voltages and the first and second selected read voltages.

The voltage managing unit 135 may include control logic 126 to control operation of the nonvolatile memory device 120 in accordance with received commands, a voltage generator 125 to generate first and second read voltages, n candidate voltages comprising a first select read voltage, and m candidate voltages comprising a second select read voltage, where n and m are natural numbers, and a register 128 to store the determined first and second select read voltages. The control logic 126 may determine whether a number of failed cells is equal to or greater than a first limit value when the first read voltage is applied to the memory cells (memory cell array 122) and may determine whether the number of failed cells is equal to or greater than a second limit value when the second read voltage is applied to the memory cells (memory cell array 122).

Referring to FIGS. 8-9, exemplary embodiments of the present general inventive concept may provide a memory system 100 that includes a nonvolatile memory device 2100 having a plurality of memory cells (nonvolatile memory chip with memory cells 2300) into which data is programmed to provide a number of failed programmed memory cells that is less than or equal to a number of failed cells correctable by performing error correction code (ECC) encoding, and a controller 2200 to change a first read voltage, which is used to determine whether the data stored in the memory cells (nonvolatile memory chip with memory cells 2300) is a first voltage state or a second voltage state, to a voltage within a first range and to determine the voltage as a first select read voltage and to change a second read voltage, which is used to determine whether the data stored in the memory cells (nonvolatile memory chip with memory cells 2300) is a third voltage state or a fourth voltage state, to a voltage within a second range and to determine the voltage as a second select read voltage, to create data added with parity bits by performing ECC encoding on data which is to be provided to the nonvolatile memory device 2100, and to correct error bits of the data added with the parity bits.

The controller 2200 may include a microprocessor 111 to change a first read voltage, which is used to determine whether the data stored in the memory cells (nonvolatile memory chip with memory cells 2300) is a first voltage state or a second voltage state, to a voltage within a first range and to determine the voltage as a first select read voltage and to change a second read voltage, which is used to determine whether the data stored in the memory cells (nonvolatile memory chip with memory cells 2300) is a third voltage state or a fourth voltage state, to a voltage within a second range and to determine the voltage as a second select read voltage, an error correction code (ECC) encoder 114 to create data added with parity bits by performing ECC encoding on data which is to be provided to the nonvolatile memory device 2100, and an ECC decoder 115 to correct error bits of the data added with the parity bits.

The nonvolatile memory device 2100 may include control logic 126 to control operation of the nonvolatile memory device 2100 in accordance with received commands, a voltage generator 125 to generate the first and second read voltages, n candidate voltages comprising the first select read voltage, and m candidate voltages comprising the second select read voltage, where n and m are natural numbers, a decoder 121 to receive the first and second read voltages and the first and second select read voltages generated by the voltage generator 125 and to drive the memory cells (nonvolatile memory chip with memory cells 2300) using the first and second read voltages and the first and second select read voltages, and a register 128 to store the determined first and second select read voltages.

The control logic 126 may determine whether a number of failed cells is equal to or greater than a first limit value when the first read voltage is applied to the memory cells (nonvolatile memory chip with memory cells 2300) and may determine whether the number of failed cells is equal to or greater than a second limit value when the second read voltage is applied to the memory cells (nonvolatile memory chip with memory cells 2300).

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of operating a memory device having a plurality of memory cells, the method comprising:
    changing a first read voltage, for determining whether data stored in memory cells is a first voltage state or a second voltage state, to a voltage within a first range and determining the voltage within the first range as a first select read voltage; and
    changing a second read voltage, for determining whether the data stored in the plurality of memory cells is a third voltage state or a fourth voltage state, to a voltage within a second range which is different from the first range and determining the voltage within the second range as a second select read voltage,
    wherein the first and second voltage states are different from the third and fourth voltage states, the first voltage state and the second voltage overlap each other, the third voltage state and the fourth voltage state overlap each other, and a difference between a voltage at an intersection of the third and fourth voltage states and the second read voltage is greater than a difference between a voltage at an intersection of the first and second voltage states and the first read voltage.

2. The method of claim 1, wherein the first range is smaller than the second range.

3. The method of claim 1, wherein the changing of the first read voltage comprises changing the first read voltage if a number of failed cells is equal to or greater than a first limit value when the first read voltage is applied to the memory cells and not changing the first read voltage if the number of failed cells is less than the first limit value when the first read voltage is applied to the memory cells, and the changing of the second read voltage comprises changing the second read voltage if the number of failed cells is equal to or greater than a second limit value when the second read voltage is applied to the memory cells and not changing the second read voltage if the number of failed cells is less than the second limit value.

4. The method of claim 3, wherein the first limit value and the second limit value are different.

5. The method of claim 3, wherein each of the first and second limit values is a number of error-correctable memory cells, where the error correctible memory cells are correctable by using error correction code (ECC).

6. The method of claim 1, wherein determining of the first selected read voltage comprises selecting as the first select read voltage a candidate voltage which produces a smallest number of failed cells when n candidate voltages within the first range are applied to the memory cells, and the determining of the second select read voltage comprises selecting as the second select read voltage a candidate voltage which produces the smallest number of failed cells when m candidate voltages within the second range are applied to the memory cells, where n and m are natural numbers.

7. The method of claim 6, wherein n and m are different.

8. A memory system comprising:
a nonvolatile memory device comprising a plurality of memory cells into which data is programmed; and
a controller configured to control the nonvolatile memory device, the controller comprising:
a microprocessor configured to change a first read voltage, for determining whether the data stored in the memory cells is a first voltage state or a second voltage state, to a voltage within a first range and to determine the voltage within the first range as a first select read voltage, and the microprocessor to change a second read voltage, for determining whether the data stored in the memory cells is a third voltage state or a fourth voltage state, to a voltage within a second range and to determine the voltage within the second range as a second select read voltage;
an error correction code (ECC) encoder to create data added with parity bits by performing ECC encoding on data which is to be provided to the nonvolatile memory device; and
an ECC decoder to correct error bits of the data added with the parity bits, wherein the nonvolatile memory device comprises:
control logic to control operation of the nonvolatile memory device in accordance with received commands;
a voltage generator to generate the first and second read voltages, n candidate voltages comprising the first select read voltage, and m candidate voltages comprising the second select read voltage, where n and m are natural numbers;
an X decoder to receive the first and second read voltages and the first and second select read voltages generated by the voltage generator and to drive the memory cells using the first and second read voltages and the first and second select read voltages; and
a register to store the determined first and second select read voltages.

9. The memory system of claim 8, wherein the control logic in configured to determine whether a number of failed cells is equal to or greater than a first limit value when the first read voltage is applied to the memory cells and to determine whether the number of failed cells is equal to or greater than a second limit value when the second read voltage is applied to the memory cells.

10. The memory system of claim 8, wherein the controller further comprises a read-only memory (ROM) to store the first and second ranges.

11. A memory system comprising:
a nonvolatile memory device having a plurality of memory cells into which data is programmed to provide a number of failed programmed memory cells that is less than or equal to a number of failed cells correctable by performing error correction code (ECC) encoding; and
a controller configured to change a first read voltage, for determining whether the data stored in the memory cells is a first voltage state or a second voltage state, to a voltage within a first range and to determine the voltage within the first range as a first select read voltage, and the controller configured to change a second read voltage, for determining whether the data stored in the memory cells is a third voltage state or a fourth voltage state, to a voltage within a second range and to determine the voltage within the second range as a second select read voltage, the controller further configured to create data added with parity bits by performing ECC encoding on data which is to be provided to the nonvolatile memory device, and to correct error bits of the data added with the parity bits.

12. The memory system of claim 11, wherein the controller comprises:
a microprocessor to change the first read voltage to the voltage within the first range and to determine the voltage within the first range as the first select read voltage, and the microprocessor further configured to change the second read voltage to the voltage within the second range and to determine the voltage within the second range as the second select read voltage;
an error correction code (ECC) encoder to create the data added with the parity bits by performing ECC encoding on the data which is to be provided to the nonvolatile memory device; and
an ECC decoder to correct the error bits of the data added with the parity bits.

13. The memory system of claim 11, wherein the nonvolatile memory device comprises:
control logic to control operation of the nonvolatile memory device in accordance with received commands;
a voltage generator to generate the first and second read voltages, n candidate voltages comprising the first select read voltage, and m candidate voltages comprising the second select read voltage, where n and m are natural numbers;
a decoder to receive the first and second read voltages and the first and second select read voltages generated by the voltage generator and to drive the memory cells using the first and second read voltages and the first and second select read voltages; and
a register to store the determined first and second select read voltages.

14. The memory system of claim 13, wherein the control logic is configured to determine whether a number of failed cells is equal to or greater than a first limit value when the first read voltage is applied to the memory cells and determines whether the number of failed cells is equal to or greater than a second limit value when the second read voltage is applied to the memory cell.

* * * * *